(12) United States Patent
Chu et al.

(10) Patent No.: US 6,645,869 B1
(45) Date of Patent: Nov. 11, 2003

(54) ETCHING BACK PROCESS TO IMPROVE TOPOGRAPHIC PLANARIZATION OF A POLYSILICON LAYER

(75) Inventors: Ching-Yun Chu, Junghe (TW); Chyei-Jer Hsieh, Tainan (TW); Teng-Shao Su, Tainan (TW); Shun-Min Yeh, Zhanghua (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/254,799

(22) Filed: Sep. 26, 2002

(51) Int. Cl.$^7$ ............................................. H01L 21/302
(52) U.S. Cl. ....................... 438/705; 704/692; 704/719; 704/725; 704/697; 704/714; 704/734
(58) Field of Search .................. 438/692, 693, 438/719, 725, 697, 705, 704, 714, 724, 734, 742, 744, 743, 723

(56) References Cited

U.S. PATENT DOCUMENTS 6,455,435 B1 * 9/2002 Lehr .......................... 438/694

* cited by examiner

*Primary Examiner*—G Goudreau
(74) *Attorney, Agent, or Firm*—Intellectual Property Solutions, Incorporated

(57) ABSTRACT

An etching back process to improve topographic planarization of a polysilicon layer. First, a polysilicon layer is formed to fill a contact hole between two adjacent insulating structures and cover the entire surface of a semiconductor substrate to a predetermined height, in which a sunken portion is formed in the polysilicon layer over the contact hole. Then, a bottom antireflective coating (BARC) layer is formed to fill the sunken portion and cover the entire surface of the polysilicon layer. Next, in a first etching step, the BARC layer outside the sunken portion of the polysilicon layer is removed and the BARC layer in the sunken portion of the polysilicon layer is retained to flatten the bottom of the sunken portion. Thereafter, in a second etching step, the etching rate of the polysilicon is decreased and the etching rate of the BARC layer is increased to remove a part of the polysilicon layer outside the sunken portion and retain some of the BARC layer inside the sunken portion, in which the BARC layer remaining in the sunken portion protrudes from the polysilicon layer. Next, the polysilicon layer outside the contact hole is completely removed.

6 Claims, 5 Drawing Sheets

ETCHING BACK PROCESS TO IMPROVE TOPOGRAPHIC PLANARIZATION OF A POLYSILICON LAYER

BACKGROUND OF THE INVENTION

1. Field of the Invention

The present invention relates to a planarization process on a common source line of a flash memory device and, more particularly, to an etching back process on a polysilicon layer to improve the topographic planarization of the common source line.

2. Description of the Related Art

A flash memory cell comprises a floating gate for storing charges and a control gate for controlling the voltage of a world line, in which the voltages of the world line and source/drain electrodes are coordinated to control the charge-stored capacity of the floating gate and decide the on/off state of a transistor. Thus, the flash memory is also called an erasable programmable read only memory, or EPROM. For early flash memory devices, a gate structure is formed by stacking the control gate on the floating gate. As for the recent flash memory device, a gate structure is formed by laterally arranging the control gate and the floating gate, in which an insulating spacer is formed on the sidewall of the floating gates, after which a common source line is formed in a space between two adjacent floating gates, and then the control gate is formed outside the floating gates.

Generally, the material of the common source line is polysilicon. However, due to limitations in the polysilicon deposition, the topographic planarization of the polysilicon layer is difficult to control in subsequent etching back process, causing a connection between the adjacent insulating spacers to fail the isolation result.

FIGS. 1A to 1C are sectional diagrams showing a common source line process according to the prior art. As shown in FIG. 1A, a silicon substrate 10 is provided with a pad oxide layer 12, a floating gate layer 14, a dielectric layer 16, and an insulating spacer structure 18. Preferably, the floating gate layer 14 is polysilicon, the dielectric layer 16 is silicon nitride, and the insulating spacer structure 18 is TEOS-oxide. In addition, a contact hole 20 is formed between two adjacent floating gate layers 14 to expose a source/drain region of the silicon substrate 10. Next, as shown in FIG. 1B, a polysilicon layer 22 of 6000 Å thickness is deposited on the entire surface of the silicon substrate 10. Since the surface profile of the polysilicon layer 22 varies depending on the topography of the silicon substrate 10, a sunken portion is found in the polysilicon layer 22 over the contact hole 20, and the depth $D_1$ of the sunken portion is approximately 1000 Å. Thereafter, as shown in FIG. 1C, using an etching back process, such as a reactive ion dry etching process, the polysilicon layer 22 outside the contact hole 20 is removed, and the polysilicon layer 22 remaining in the contact hole 20 serves as a common source line 24.

However, during the etching back process, it is difficult to adjust the process conditions of the dry etching to accurately control the topographic planarization of the polysilicon layer 22. Also, this may cause overetching on the polysilicon layer 22 over the contact hole to form a corresponding sunken portion on the top of the common source line 24, in which the thickness $D_2$ of the sunken portion is 130–140 Å. Furthermore, as the overetching time is increasing, the thickness of the dielectric layer 16 is decreasing, resulting in a decreased CD value of the line width by measuring the common source line 24, and a failed isolation provided by the insulating spacer structure 18.

Seeking to solve this problem, a chemical mechanical polishing (CMP) method is employed to level off the polysilicon layer 22 to improve the topographic planarization of the common source line 24. The CMP method, however, has disadvantages of expensive process costs, pollutant byproducts, and process defects, so integrating the CMP method into the common source line process cannot be applied to mass production.

SUMMARY OF THE INVENTION

The present invention uses an etching back process to improve topographic planarization of a polysilicon layer to solve the problems caused by the prior method.

In the etching back process, a polysilicon layer is formed to fill a contact hole between two adjacent insulating structures and cover the entire surface of a semiconductor substrate to a predetermined height, in which a sunken portion is formed in the polysilicon layer over the contact hole. Then, a bottom antireflective coating (BARC) layer is formed to fill the sunken portion and cover the entire surface of the polysilicon layer. Next, in a first etching step, the BARC layer outside the sunken portion of the polysilicon layer is removed and the BARC layer in the sunken portion of the polysilicon layer is retained to flatten the bottom of the sunken portion. Thereafter, in a second etching step, the etching rate of the polysilicon is decreased while that of the BARC layer is increased to remove a part of the polysilicon layer outside the sunken portion and retain some of the BARC layer inside the sunken portion, in which the BARC layer remaining in the sunken portion protrudes from the polysilicon layer. Next, the polysilicon layer outside the contact hole is completely removed.

Accordingly, it is a principal object of the invention to improve the topographic planarization of the common source line to obtain a superior flat top.

It is another object of the invention to separate the adjacent insulating spacer structures from each other to ensure the required isolating result.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE INVENTION

Figure 1A:
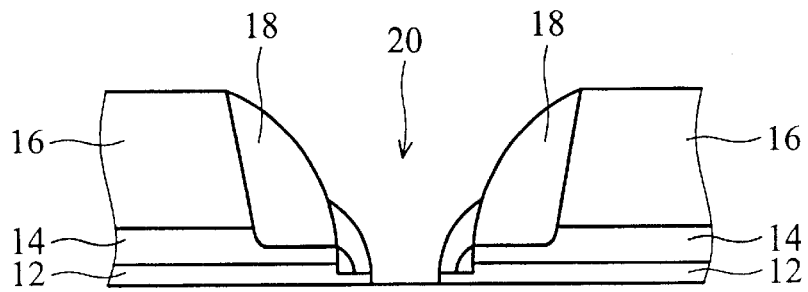
FIGS. 1A to 1C are sectional diagrams showing a common source line process according to the prior art.
Figure 1B:
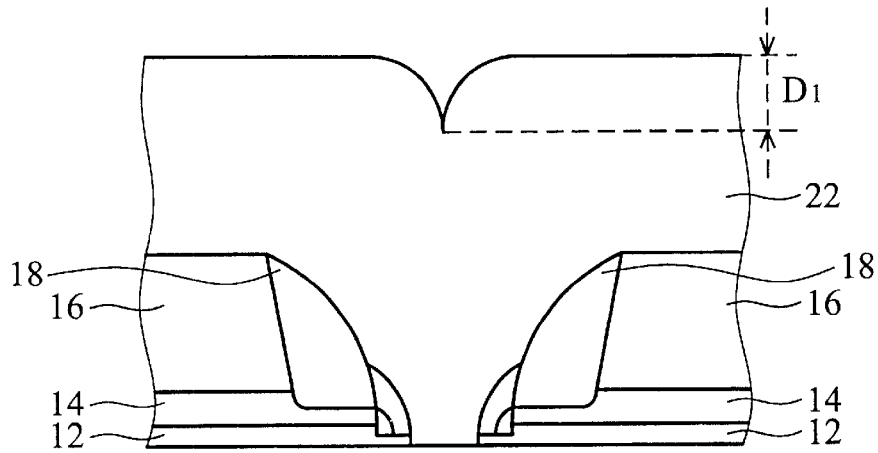
Figure 1C:
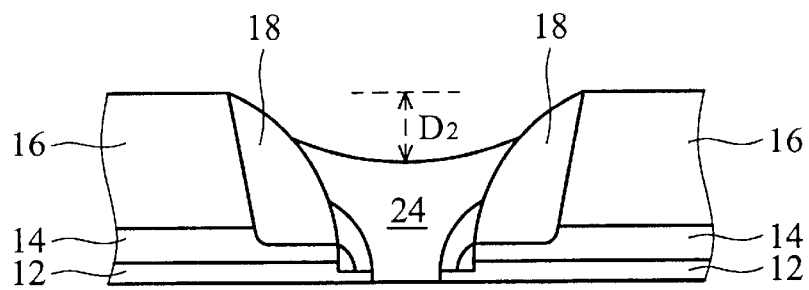
Figure 2A:
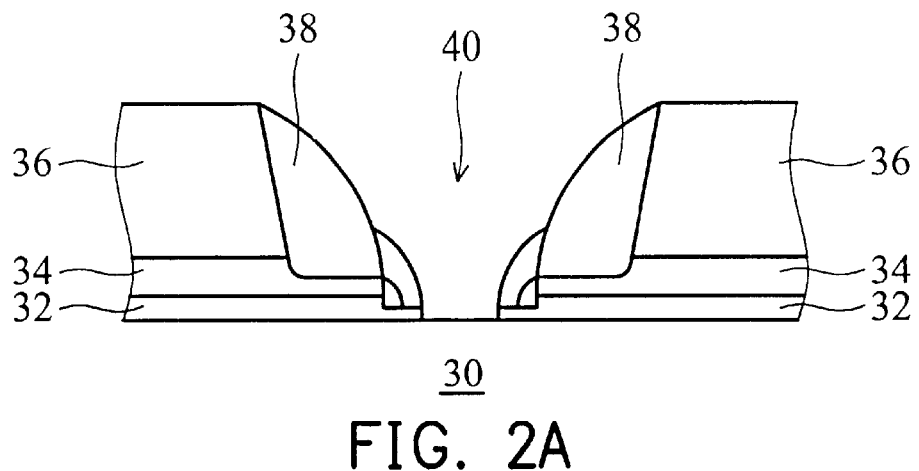
FIGS. 2A to 2G are sectional diagrams showing a common source line process according to the present invention.

FIGS. 2A to 2G are sectional diagrams showing a common source line process according to the present invention. As shown in FIG. 2A, a silicon substrate 30 is provided with a pad oxide layer 32, a floating gate layer 34, a dielectric layer 36, and an insulating spacer structure 38. Preferably, the floating gate layer 34 is polysilicon, the dielectric layer 36 is silicon nitride, and the insulating spacer structure 38 is TEOS-oxide. In addition, a contact hole 40 is formed between two adjacent floating gate layers 34 to expose a source/drain region of the silicon substrate 30.

Figure 2B:
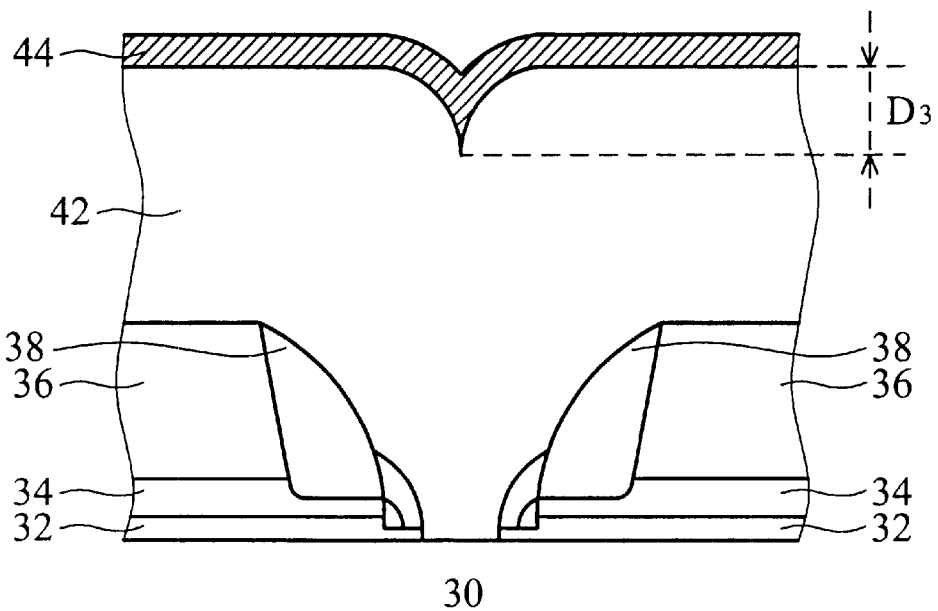

Next, as shown in FIG. 2B, a polysilicon layer 42 of 6000 Å thickness is deposited on the entire surface of the silicon substrate 30. Since the surface profile of the polysilicon layer 42 varies depending on the topography of the silicon substrate 30, a sunken portion is found in the polysilicon layer 42 over the contact hole 40, and the depth $D_3$ of the sunken portion is approximately 1000 Å. Thereafter, a bottom antireflective coating (BARC) layer 44 of approximately 1400 Å thickness is deposited on the polysilicon layer 42 to fill the sunken portion.

Hereinafter, an etching back process with four steps is described. The process can remove the polysilicon layer 42 outside the contact hole 40 and retain the polysilicon layer 42 inside the contact hole 40 to provide a common source line 46 with an improved topographic planarization.

Figure 2C:
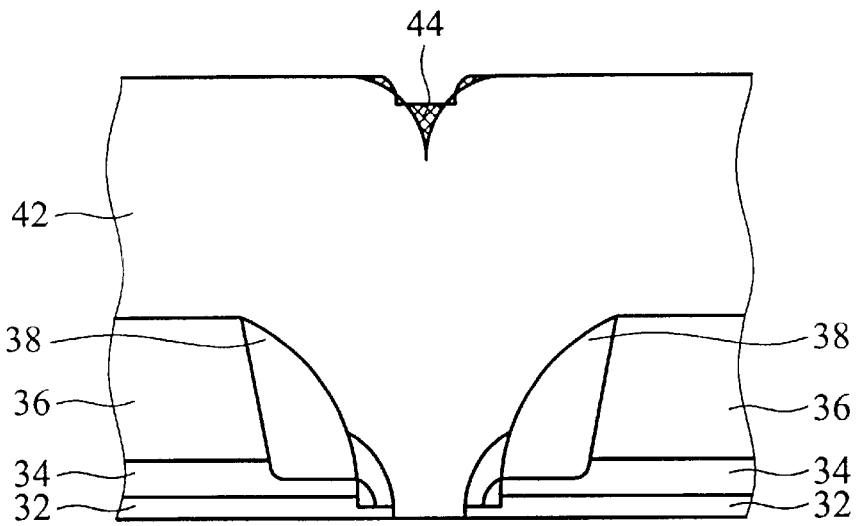
Figure 2D:
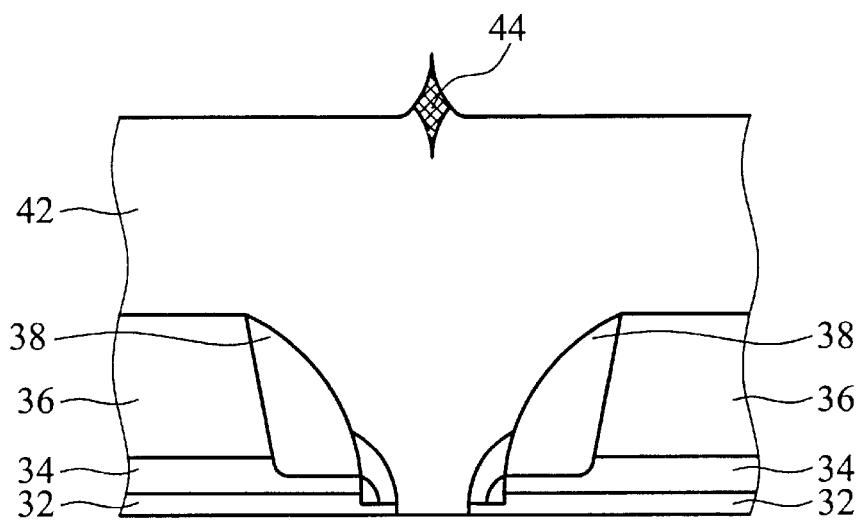

In the first step, the BARC layer 44 is removed to fine tune the topographic planarization. During the first part of the first step, as shown in FIG. 2C, most of the BARC layer 44 on the flat area of the polysilicon layer 42 is removed, and some of the BARC layer 44 in the sunken portion of the polysilicon layer 42 is kept. This flattens the bottom of the sunken portion. During the second part of the first step, as shown in FIG. 2D, the etching rate of the polysilicon layer 42 is decreased, the etching rate of the BARC layer 44 is increased and the etching selectivity of the polysilicon layer 42 to the BARC layer 44 is adjusted to 0.75~0.65 (the optimum is 0.68), and thus a part of the flat area of the polysilicon layer 42 is removed to reduce the amount of the BARC layer 44 remaining in the sunken portion protruding from the polysilicon layer 42.

Preferably, in the first step, the source power is 500 W, the bias power is 40 W, the etching gas is $CF_4$, and the gas flow rate is 40~60 sccm (the optimum is 50 sccm).

Figure 2E:
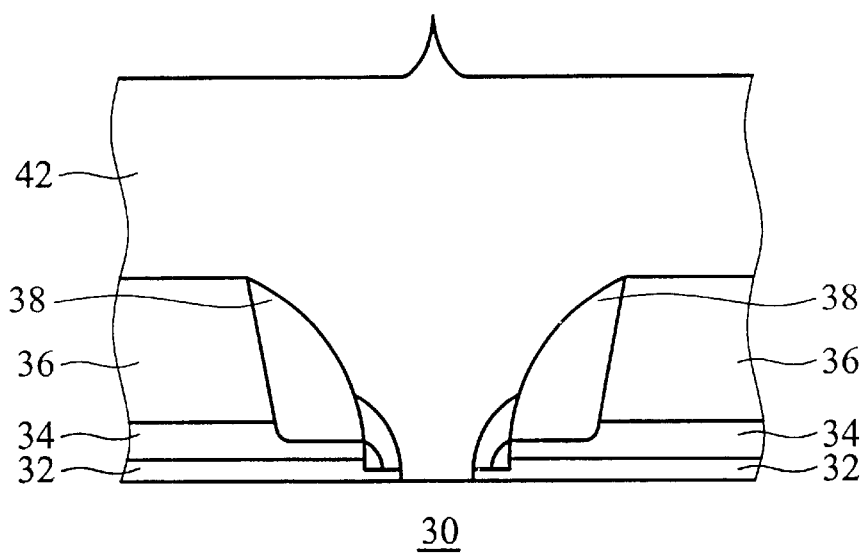

In the second step, a bulk etching on the polysilicon layer 42, as shown in FIG. 2E, the BARC layer 44 is completely removed and most of the polysilicon layer 42 is removed to a predetermined height. Preferably, the source power is 750 W, the bias power is 40 W, and the etching gas comprises $CF_4$ (50 sccm) and $SF_6$ (40 sccm).

Figure 2F:
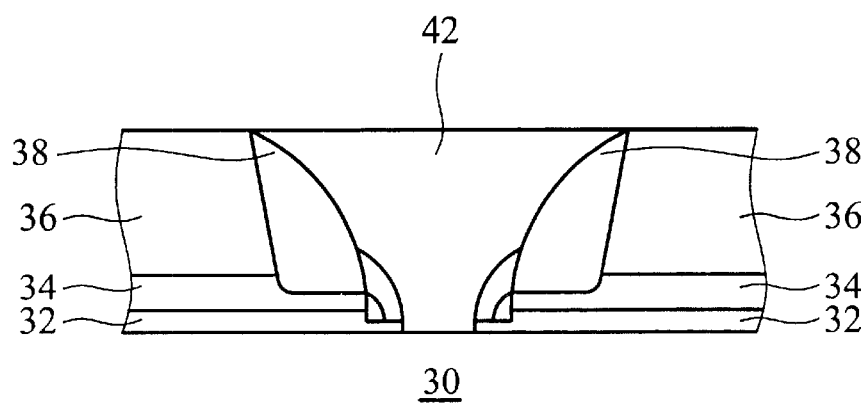

In the third step, a main etching of the polysilicon layer 42, as shown in FIG. 2F, the polysilicon layer 42 outside the contact hole 40 is removed and the main etching is stopped at the surfaces of the dielectric layer 36 and the insulating spacer structure 38. This obtains superior planarization on the polysilicon layer 42. Preferably, the source power is 400 W, the bias power is 40 W, and the etching gas comprises $CF_4$ (10 sccm) and $Cl_2$ (130 sccm).

Figure 2G:
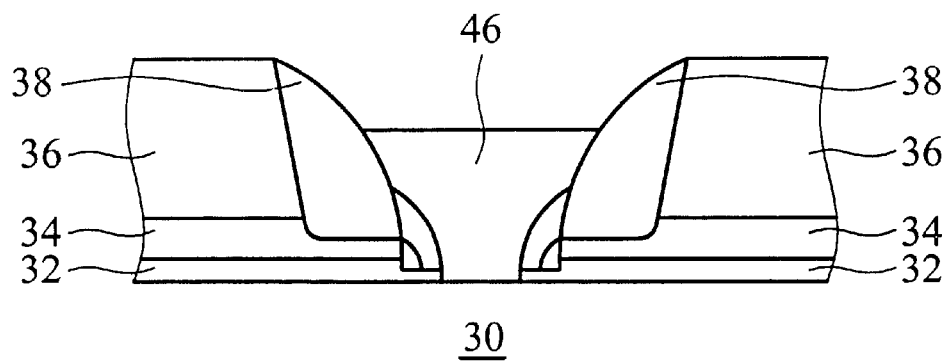

In the fourth step, an overetching of the polysilicon layer 42, as shown in FIG. 2G, the polysilicon layer 42 remaining in the contact hole 40 is etched to a predetermined depth, in which the top of the insulating spacer structure 38 protrudes from the polysilicon layer 42 to ensure the isolation result of the insulating spacer structure 38. Therefore, the polysilicon layer 42 remaining in the contact hole 40 serves as a common source line 46. Preferably, the source power is 400 W, the bias power is 40 W, and the etching gas comprises $CF_4$ (10 sccm) and $Cl_2$ (130 sccm).

According to scanning electron microscope (SEM) images, in the conventional etching back method, the sunken depth of the common source line is 130~140 nm and adjacent insulating spacer structures provide an S-shaped connection that cannot ensure the required isolating result. By comparison, in the etching back method of the present invention, the topographic planarization of the common source line is improved to obtain a superior flat top. Also, the present invention can accurately control overetching to separate the adjacent insulating spacer structures from each other, thus ensuring the required isolating result of the insulating spacer structures.

It is to be understood that the present invention is not limited to the embodiments described above, but encompasses any and all embodiments within the scope of the following claims.

What is claimed is:

1. An etching back process to improve topographic planarization of a polysilicon layer, comprising steps of:

providing a semiconductor substrate having two adjacent insulating structures and a contact hole formed between the two insulating structures;

forming a polysilicon layer to fill the contact hole and cover the entire surface of the semiconductor substrate to a predetermined height, in which a sunken portion is formed in the polysilicon layer over the contact hole;

forming a bottom antireflective coating (BARC) layer to fill the sunken portion and cover the entire surface of the polysilicon layer;

performing a first etching step to completely remove the BARC layer outside the sunken portion of the polysilicon layer and retain the BARC layer in the sunken portion of the polysilicon layer to flatten the bottom of the sunken portion;

performing a second etching step to decrease the etching rate of the polysilicon and increase the etching rate of the BARC layer to remove a part of the polysilicon layer outside the sunken portion and retain some of the BARC layer inside the sunken portion, in which the BARC layer remaining in the sunken portion protrudes from the polysilicon layer; and etching the polysilicon layer to completely remove the polysilicon layer outside the contact hole.

2. The etching back process to improve topographic planarization of a polysilicon layer according to claim 1, wherein the first etching step uses $CF_4$ of 40~60 sccm flow rate as the etching gas.

3. The etching back process to improve topographic planarization of a polysilicon layer according to claim 1, wherein the second etching step uses $CF_4$ of 40~60 sccm flow rate as the etching gas.

4. The etching back process to improve topographic planarization of a polysilicon layer according to claim 1, wherein in the second etching step, the etching selectivity of the polysilicon layer to the BARC layer is 0.75~0.65.

5. The etching back process to improve topographic planarization of a polysilicon layer according to claim 1, further comprising a step of overetching the polysilicon layer to remove the polysilicon layer inside the contact hole to a predetermined depth.

6. The etching back process to improve topographic planarization of a polysilicon layer according to claim 1, wherein the polysilicon layer remaining in the contact hole serves as a common source line of a flash memory device.

* * * * *